(12) United States Patent
Bhattacharjee et al.

(10) Patent No.: US 6,965,337 B1
(45) Date of Patent: Nov. 15, 2005

(54) REFERENCE GENERATOR

(75) Inventors: Jishnu Bhattacharjee, San Jose, CA (US); Debanjan Mukherjee, San Jose, CA (US); Fabian Giroud, San Jose, CA (US)

(73) Assignee: Scintera Networks, Inc., San Jose, CA (US)

( * ) Notice: Subject to any disclaimer, the term of this patent is extended or adjusted under 35 U.S.C. 154(b) by 0 days.

(21) Appl. No.: 10/899,498

(22) Filed: Jul. 26, 2004

(51) Int. Cl.[7] ............................................... H03M 1/12
(52) U.S. Cl. ..................................... 341/155; 341/144
(58) Field of Search ................................ 341/144, 155, 341/135, 154; 326/30, 31, 33, 34; 327/108, 327/109, 530, 538

(56) References Cited

U.S. PATENT DOCUMENTS

| | | | | |
|---|---|---|---|---|
| 4,337,441 A | * | 6/1982 | Kellogg | ...................... 330/261 |
| 4,684,924 A | * | 8/1987 | Wood | ........................... 341/122 |
| 4,894,657 A | * | 1/1990 | Hwang et al. | ............... 341/158 |
| 5,043,732 A | * | 8/1991 | Robertson et al. | ........... 341/156 |
| 5,517,134 A | * | 5/1996 | Yaklin | ........................... 327/65 |
| 6,806,728 B2 | * | 10/2004 | Nguyen et al. | ................ 326/30 |

* cited by examiner

*Primary Examiner*—Brian Young
(74) *Attorney, Agent, or Firm*—MacPherson Kwok Chen & Heid LLP; Greg J. Michelson

(57) ABSTRACT

Systems and methods are disclosed herein to provide reference generators. For example, in accordance with an embodiment of the present invention, a reference generator is provided for an electrical device, such as for example for an analog-to-digital converter. The reference generator may provide one or more reference signals having a common mode voltage that can track or be varied based on a common mode voltage of an input signal. Alternatively or in addition, the reference generator may provide reference signals for single-ended applications.

19 Claims, 3 Drawing Sheets

REFERENCE GENERATOR

TECHNICAL FIELD

The present invention relates generally to electrical circuits and, more particularly, to reference generators.

BACKGROUND

Reference generators are employed in a variety of circuit applications where one or more reference signals are desired. For example, a reference generator may be employed to provide a reference signal for an analog-to-digital converter (ADC).

One drawback of a conventional reference generator is that the generated reference signal does not adjust according to an input signal (e.g., to an ADC). As an example, a common mode voltage of the generated reference signal may be fixed and, therefore, would be unable to adjust if a common voltage of the input signal were to vary. Furthermore, the conventional reference generator may lack the flexibility to be incorporated into a variety of applications having various input signals and reference voltage requirements. As a result, there is a need for improved reference generator techniques.

SUMMARY

Systems and methods are disclosed herein to provide reference generators. For example, in accordance with an embodiment of the present invention, a reference generator is provided for an electrical device, such as for example for an analog-to-digital converter. The reference generator may provide one or more reference signals having a common mode voltage that can be varied based on a common mode voltage of an input signal. Furthermore, the reference generator may provide reference signals for single-ended or differential signal applications.

More specifically, in accordance with one embodiment of the present invention, an integrated circuit includes a first circuit adapted to receive one or more reference signals; and a reference generator adapted to provide the one or more reference signals, wherein the reference generator includes differential amplifiers adapted to compare a common mode voltage of a differential input signal to a common mode voltage of the one or more reference signals and provide a first signal based on the comparison; and a reference ladder adapted to receive the first signal and provide the one or more reference signals, wherein the first signal controls the common mode voltage of the one or more reference signals.

In accordance with another embodiment of the present invention, a reference generator includes a reference ladder circuit adapted to provide at least one single-ended reference signal or at least one differential reference signal; a first circuit adapted to compare a first reference signal to one of the single-ended reference signals and, based on the comparison, provide a first signal to the reference ladder circuit to control a voltage level of the single-ended reference signals; and a second circuit adapted to compare a common mode voltage level of the differential reference signal to a common mode voltage level of a differential input signal and, based on the comparison, provide a second signal to the reference ladder circuit to control the common mode voltage level of the differential reference signals.

In accordance with another embodiment of the present invention, a method of providing one or more reference signals includes sensing a common mode voltage of an input signal; comparing the common mode voltage of the input signal to a common mode voltage of the reference signals; and modifying the common mode voltage of the reference signals to track the common mode voltage of the input signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
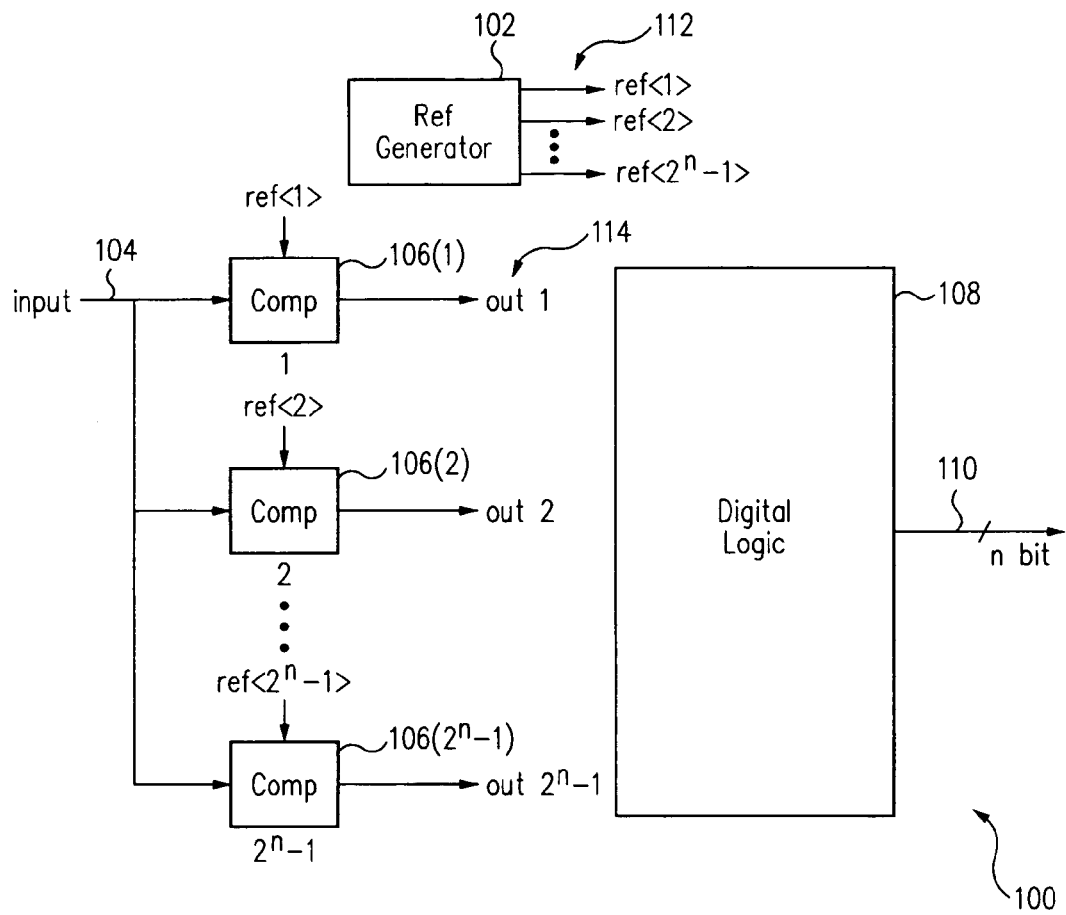
FIG. 1 shows a block diagram illustrating an exemplary application for a reference generator in accordance with an embodiment of the present invention.

FIG. 1 shows a circuit 100, which is a circuit block diagram illustrating an exemplary application for a reference generator 102 in accordance with an embodiment of the present invention. For example, circuit 100 may represent a flash analog-to-digital converter (ADC) that receives an input signal 104 (e.g., an analog signal) and provides an output signal 110 (e.g., an n-bit digital signal).

Comparators 106 compare input signal 104 to reference signals 112 (e.g., labeled ref<1> through ref<$2^n-1$>), provided by reference generator 102, and provide corresponding output signals 114 (e.g., labeled out 1 through out $2^n-1$) to a logic circuit 108 (e.g., a digital logic circuit) that provides output signal 110. Reference signals 112 from reference generator 102 are provided to corresponding ones of comparators 106 (which are separately referenced as comparator 106(1) through comparator 106($2^n-1$)) as illustrated in FIG. 1 (e.g., ref<1> to comparator 106(1), ref<2> to comparator 106(2), . . . , and ref<$2^n-1$> to comparator 106($2^n-1$)).

As indicated above, circuit 100 may represent an exemplary application for reference generator 102. The flash ADC portion of circuit 100 (i.e., comparators 106 and logic circuit 108) may represent and operate as a conventional flash ADC (e.g., a word at a time architecture) as is known in the art. Reference generator 102, in accordance with an embodiment of the present invention, may be implemented to provide differential operation, single-ended operation, or selectively both, depending upon the requirements or desired application.

For example, in differential operation, reference generator 102 adjusts a common-mode value of reference signals 112

(e.g., the ADC reference voltage) to track a common-mode value of input signal 104 (e.g., a differential input). In single-ended operation, reference generator 102 may set and provide one or more of reference signals 112 (e.g., the ADC reference voltage) to a scaled version of a bandgap voltage. Furthermore, as an example, the differential or single-ended operation may include dominant-pole compensation to provide unconditional stability.

Figure 2:
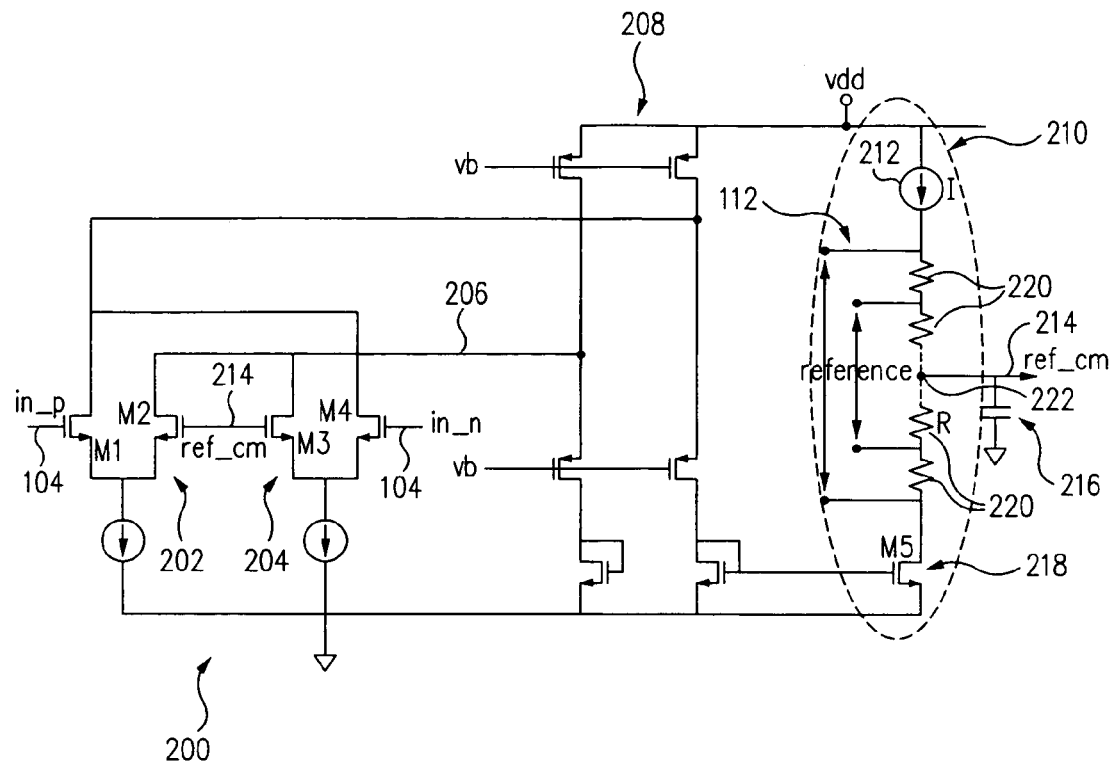
FIG. 2 shows a circuit diagram for the reference generator of FIG. 1 in accordance with an embodiment of the present invention.

As an example, FIG. 2 shows a circuit 200, which is an exemplary circuit implementation for differential operation for reference generator 102 of FIG. 1 in accordance with an embodiment of the present invention. Circuit 200 receives input signal 104 (i.e., a differential input signal whose signals are labeled in_p and in_n) via differential amplifiers 202 and 204, respectively, which also receive a reference signal 214 (labeled ref_cm). Reference signal 214, generated by circuit 200, provides a common-mode voltage of reference signals 112.

Differential amplifiers 202 and 204 sense the difference between the common-mode voltage of input signal 104 and the common-mode voltage of reference signals 112 (as provided by reference signal 214) and amplifies the difference to provide a difference signal 206. Difference signal 206 is fed back to a transistor 218 (e.g., providing a variable resistance) via a circuit 208 (which also receives a bias voltage (labeled Vb) and a supply voltage (labeled Vdd)). In general, as a resistance value of transistor 218 increases (under control of difference signal 206), a voltage level of reference signal 214 (i.e., a common-mode voltage level of reference signals 112) increases also.

A reference ladder 210 in circuit 200 includes a current source 212, transistor 218, and a plurality of resistors 220. Reference ladder 210 provides reference signals 112 and reference signal 214. Reference signals 112 (which for this example are provided as differential signals, e.g., ref<1>, ref<2>, ..., ref<$2^n$–1>) are taken from corresponding points from among resistors 220 (e.g., as illustrated by the double-headed arrows designating exemplary corresponding points among resistors 220).

A current I, flowing through reference ladder 210, controls a resolution (e.g., a least significant bit (LSB)) of reference ladder 210 (e.g., an ADC reference ladder). For example, a step size (or LSB) may be determined by a value of the current I times a value of a resistance (R) of one of resistors 220 (or I times R, where each of resistors 220 has the same resistor value (R)). The step size may be determined independent of a resistance provided by transistor 218.

A common-mode node 222 of reference ladder 210, which provides reference signal 214 (labeled ref_cm), may also include a capacitor 216 to function as a dominant pole for a first order negative feedback loop (e.g., for providing reference signal 214). The dominant pole may also improve power supply rejection for reference signal 214 and provide voltage stability (e.g., to filter out power supply voltage fluctuations).

In general, circuit 200 illustrates a reference ladder architecture for providing reference voltages 112 and common-mode tracking of input signal 104 having differential inputs. Circuit 200 may provide various functions. For example, circuit 200 senses a common mode voltage of a differential input signal (e.g., input signal 104) to be measured. Circuit 200 also compares the common mode voltage of the differential input signal with a common mode voltage of a reference signal (e.g., reference signal 214). Additionally, circuit 200 changes the common mode voltage of the reference signal in the appropriate direction to track the common mode voltage of the differential input signal (e.g., to provide negative feedback).

Figure 3:
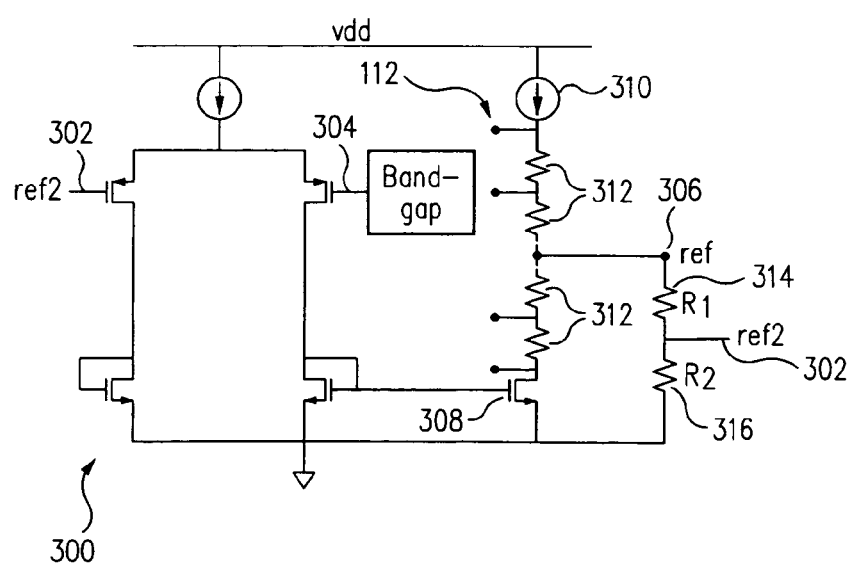
FIG. 3 shows a circuit diagram for the reference generator of FIG. 1 in accordance with an embodiment of the present invention.

As another example, FIG. 3 shows a circuit 300, which is an exemplary implementation for single-ended operation for reference generator 102 of FIG. 1 in accordance with an embodiment of the present invention. Circuit 300 compares a reference voltage 302 with a reference voltage 304, with a result of the comparison provided to a transistor 308 (e.g., to vary its resistance).

Transistor 308 is coupled to a number of resistors 312 and a current source 310, with circuit 300 providing one or more of reference signals 112 (e.g., $2^n$–1 single-ended reference signals). A reference signal 306, which may be selected from any one of reference signals 112 in FIG. 3, may be divided down via resistors 314 and 316 to an appropriate voltage level to generate reference signal 302, which is compared to reference signal 304. In general, reference signal 306 may be reduced to generate reference signal 302 to compare to a voltage level of reference signal 304, such that reference signal 304 is approximately equal to a voltage level of reference signal 306 times a resistance (R2) of resistor 316 divided by the sum of the resistance (R2) of resistor 316 and a resistance (R1) of resistor 314. It should be noted that in general the resistance provided by resistors 314 and 316 will be much greater than the parallel current path provided through transistor 308 and a certain number of resistors 312.

Alternatively, reference signal 306 may be compared directly to reference signal 304 (i.e., feedback reference signal 306 as reference signal 302 for comparison to reference signal 304) if a voltage level of reference signal 306 is suitable for comparison relative to a voltage level of reference signal 304. As an example, reference signal 304 may be generated by bandgap reference voltage techniques to provide a stable reference voltage, such as for example as described in U.S. patent application Ser. No. 10/724,440, filed Nov. 26, 2003 and entitled "Trimmable Bandgap Voltage Reference."

As discussed herein, reference generator 102 of FIG. 1 may be implemented for differential operation (e.g., as discussed in reference to FIG. 2) or for single-ended operation (e.g., as discussed in reference to FIG. 3). Alternatively, reference generator 102 may be implemented to selectively provide differential operation or single-ended operation.

Figure 4:
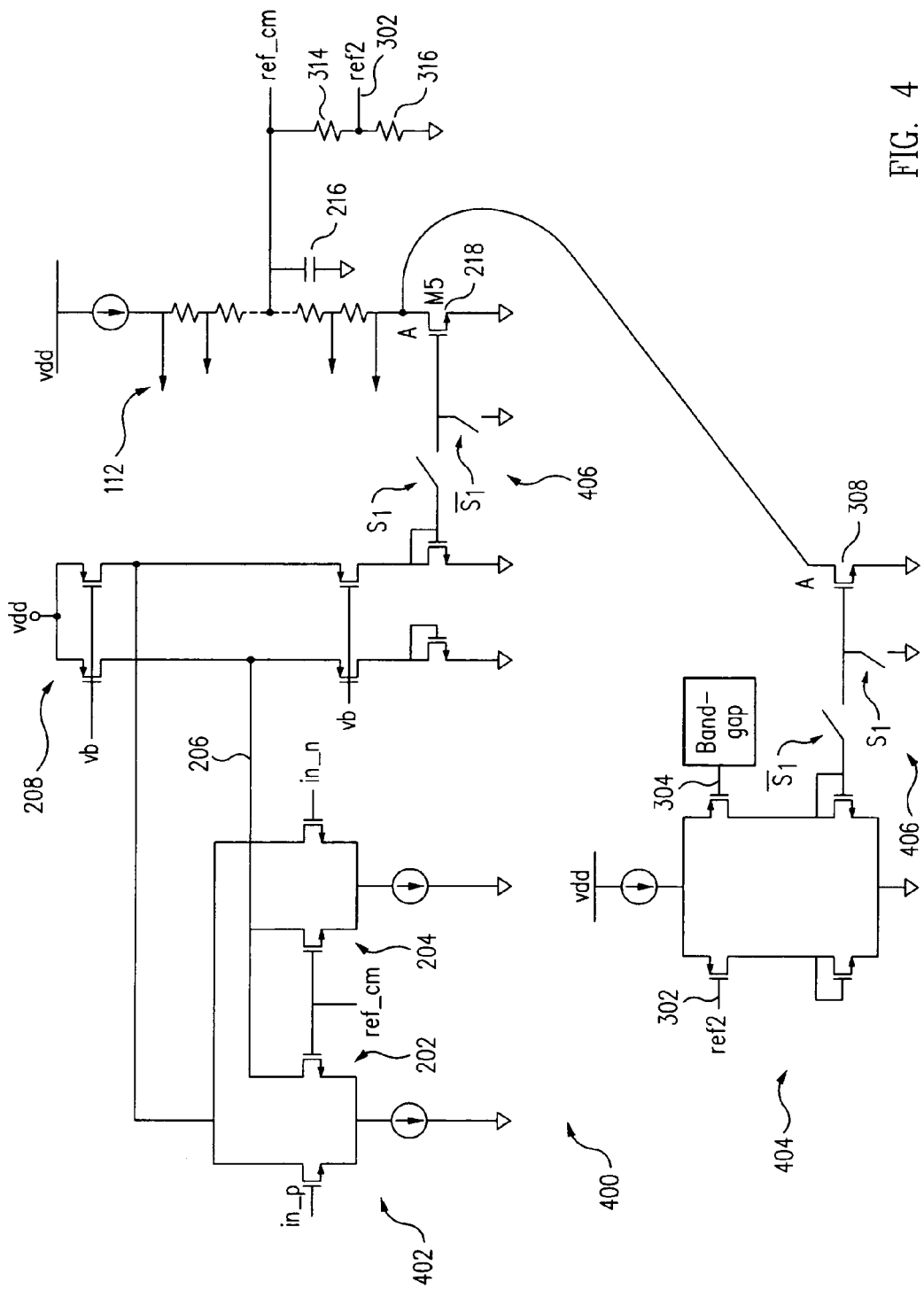
FIG. 4 shows a circuit diagram for the reference generator of FIG. 1 in accordance with an embodiment of the present invention.

For example, FIG. 4 shows a circuit 400, which is an exemplary circuit implementation for reference generator 102 of FIG. 1 in accordance with an embodiment of the present invention. Circuit 400 includes a circuit 402 and a circuit 404, with circuit 402 providing differential operation as described similarly for circuit 200 (FIG. 2) and circuit 404 providing single-ended operation as described similarly for circuit 300 (FIG. 3). Switches 406 are provided to allow the selection of differential operation (circuit 402) or single-ended operation (circuit 404). For example, when a signal S1 is asserted, circuit 402 is selected and circuit 404 is deselected, while when the signal S1 is deasserted, circuit 402 is deselected and circuit 404 is selected.

It should also be understood that reference generator 102 may include a number of circuits 200 and/or circuits 300 to provide the desired number of reference signals. For example, reference generator 102 may include one or more of circuits 200, 300, and/or 400 to provide the desired reference signals utilizing the techniques discussed herein.

In accordance with one or more embodiments of the present invention, a reference generator is provided for various circuit applications. For example, the reference generator may be employed to provide reference voltages for an ADC. The reference generator may provide a reference common mode for differential operation that tracks a common mode of an input signal to the ADC. The reference generator may alternatively or also provide one or more reference signals for single-ended operation. It should also be understood that the circuit implementations are exemplary and are not limiting. For example, the choice of transistors (e.g., NMOS or PMOS) will depend upon the application (e.g., the signal levels to be tracked).

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a first circuit adapted to receive one or more reference signals; and
   a reference generator adapted to provide the one or more reference signals, wherein the reference generator comprises:
      differential amplifiers adapted to compare a common mode voltage of a differential input signal to a common mode voltage of the one or more reference signals and provide a first signal based on the comparison; and
      a reference ladder adapted to receive the first signal and provide the one or more reference signals, wherein the first signal controls the common mode voltage of the one or more reference signals.

2. The integrated circuit of claim 1, wherein the reference ladder comprises:
   a current source;
   a plurality of resistors, wherein the one or more reference signals are provided from corresponding nodes among the plurality of resistors; and
   a transistor, wherein the transistor is adapted to receive the first signal which varies a resistance of the transistor to determine the common mode voltage of the one or more reference signals.

3. The integrated circuit of claim 2, wherein each of the resistors has a first resistor value and a resolution of the reference ladder is determined by the first resistor value and a current flowing through the reference ladder.

4. The integrated circuit of claim 1, wherein the common mode voltage of the one or more reference signals tracks the common mode voltage of the differential input signal.

5. The integrated circuit of claim 1, wherein the first circuit is an analog-to-digital converter adapted to receive the differential input signal and provide a digital output signal.

6. The integrated circuit of claim 1, further comprising a capacitor coupled to the reference ladder.

7. The integrated circuit of claim 5, wherein the capacitor provides dominant pole compensation and voltage stability.

8. The integrated circuit of claim 1, wherein the reference generator is further adapted to provide a single-ended reference signal, wherein the reference generator further comprises:
   a comparison circuit adapted to compare a first reference voltage to the single-ended reference signal and provide a second signal; and
   a second transistor, coupled to the reference ladder, adapted to receive the second signal and control a voltage level of the single-ended reference signal.

9. The integrated circuit of claim 8, wherein the first reference signal is a bandgap reference voltage.

10. The integrated circuit of claim 8, further comprising at least one switch, wherein the switch is controlled to determine whether the single-ended reference signal or the one or more reference signals are provided by the reference generator.

11. A reference generator comprising:
    a reference ladder circuit adapted to provide at least one single-ended reference signal or at least one differential reference signal;
    a first circuit adapted to compare a first reference signal to one of the single-ended reference signals and, based on the comparison, provide a first signal to the reference ladder circuit to control a voltage level of the single-ended reference signals; and
    a second circuit adapted to compare a common mode voltage level of the differential reference signal to a common mode voltage level of a differential input signal and, based on the comparison, provide a second signal to the reference ladder circuit to control the common mode voltage level of the differential reference signals.

12. The reference generator of claim 11, wherein the reference ladder circuit comprises;
    a current source;
    a plurality of resistors; and
    at least a first transistor adapted to vary its resistance based on a value of the first signal or the second signal.

13. The reference generator of claim 11, further comprising at least one switch, wherein the at least one switch determines whether the single-ended reference signals or the differential reference signals are provided by the reference generator.

14. The reference generator of claim 11, wherein the second signal controls the common mode voltage level of the differential reference signals to track the common mode voltage level of the differential input signal.

15. The reference generator of claim 11, further comprising a capacitor coupled to the reference ladder circuit.

16. The reference generator of claim 15, wherein the capacitor provides dominant pole compensation and power supply rejection.

17. A method of providing one or more reference signals, the method comprising:
    sensing a common mode voltage of an input signal;
    comparing the common mode voltage of the input signal to a common mode voltage of the reference signals; and
    modifying the common mode voltage of the reference signals to track the common mode voltage of the input signal.

18. The method of claim 17, further comprising providing dominant pole compensation to provide voltage stability for the reference signals.

19. The method of claim 17, further comprising:
    comparing the reference signals to a first reference signal;
    modifying a voltage level of the reference signals based on the comparing; and
    providing the reference signals as single-ended signals or as differential signals.

* * * * *